United States Patent
Yoshinaga

(10) Patent No.: US 11,328,720 B2
(45) Date of Patent: May 10, 2022

(54) INTER-OCCUPANT CONVERSATION DEVICE AND INTER-OCCUPANT CONVERSATION METHOD

(71) Applicant: Mitsubishi Electric Corporation, Tokyo (JP)

(72) Inventor: Ryuji Yoshinaga, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 74 days.

(21) Appl. No.: 16/755,856

(22) PCT Filed: Dec. 26, 2017

(86) PCT No.: PCT/JP2017/046656
§ 371 (c)(1),
(2) Date: Apr. 13, 2020

(87) PCT Pub. No.: WO2019/130428
PCT Pub. Date: Jul. 4, 2019

(65) Prior Publication Data
US 2021/0201903 A1    Jul. 1, 2021

(51) Int. Cl.
*G10L 15/22* (2006.01)
*B60W 50/10* (2012.01)

(52) U.S. Cl.
CPC ............ *G10L 15/22* (2013.01); *B60W 50/10* (2013.01); *B60W 2540/01* (2020.02); *B60W 2540/21* (2020.02); *G10L 2015/223* (2013.01)

(58) Field of Classification Search
USPC .................. 704/246, 247, 251, 252, 275
See application file for complete search history.

(56) References Cited

U.S. PATENT DOCUMENTS

2004/0031063 A1* 2/2004 Satoda ............. H04N 21/26283
725/143
2008/0062252 A1* 3/2008 Kawamura ............ H04N 7/152
348/14.09
(Continued)

FOREIGN PATENT DOCUMENTS

JP    2001-105989 A    4/2001
JP    2006-186867 A    7/2006
(Continued)

OTHER PUBLICATIONS

Office Action dated Nov. 24, 2020 in corresponding Chinese Patent Application No. 201780097674.X with an English Translation.
(Continued)

*Primary Examiner* — Leonard Saint Cyr
(74) *Attorney, Agent, or Firm* — Birch, Stewart, Kolasch & Birch, LLP

(57) ABSTRACT

A rear display displays a driver image of a driver to a rear occupant. An operational information acquisition unit acquires operational information for changing a size of the driver image displayed on the rear display. An image control unit changes the size of the driver image displayed on the rear display, on the basis of the operational information acquired by the operational information acquisition unit. A sound control unit controls, at a time of generating a synthetic sound by combining a spoken voice of the driver with a reproduced sound of an AV source, a sound-level ratio between the spoken voice of the driver and the reproduced sound of the AV source, on the basis of the size of the driver image displayed on the rear display. A rear speaker outputs the synthetic sound generated by the sound control unit toward the rear occupant.

9 Claims, 7 Drawing Sheets

(56) References Cited

U.S. PATENT DOCUMENTS

| | | | | |
|---|---|---|---|---|
| 2008/0147321 A1* | 6/2008 | Howard | ............ | G01C 21/3673 |
| | | | | 701/431 |
| 2009/0022330 A1* | 1/2009 | Haulick | ............... | H04M 9/082 |
| | | | | 381/57 |
| 2012/0078619 A1* | 3/2012 | Sakai | ................. | H04M 1/6016 |
| | | | | 704/225 |
| 2012/0110511 A1* | 5/2012 | Howard | ................ | G01C 21/36 |
| | | | | 715/835 |
| 2013/0223643 A1* | 8/2013 | Sato | ........................ | G08B 3/10 |
| | | | | 381/86 |

FOREIGN PATENT DOCUMENTS

| | | |
|---|---|---|
| JP | 2008-67203 A | 3/2008 |
| JP | 2008-120262 A | 5/2008 |
| JP | 2010-83452 A | 4/2010 |

OTHER PUBLICATIONS

International Search Report dated Feb. 13, 2018 in PCT/JP2017/046656 filed Dec. 26, 2017.
Chinese Office Action dated Jul. 30, 2021 issued in corresponding Chinese Patent Application No. 201780097674.X with English Machine Translation.
Chinese Office Action dated Feb. 9, 2022 issued in corresponding Chinese Patent Application No. 201780097674.X with an English Translation.

* cited by examiner

⟨Screen-Size Ratio⟩

| FIG. 3A | FIG. 3B | FIG. 3C |
|---|---|---|
| 0.5 : 0.5 | 0.2 : 0.8 | 0.7 : 0.3 |

⟨Sound-Level Ratio⟩

| | Sound Level of AV-Source Reproduced Sound | Sound Level of Driver's Spoken Voice |
|---|---|---|
| FIG. 3A | 0.5 | 0.5 |
| FIG. 3B | 0.2 | 0.8 |
| FIG. 3C | 0.7 | 0.3 |

INTER-OCCUPANT CONVERSATION DEVICE AND INTER-OCCUPANT CONVERSATION METHOD

TECHNICAL FIELD

The present invention relates to an inter-occupant conversation device and an inter-occupant conversation method for causing occupants in a vehicle cabin to make conversation with each other.

BACKGROUND ART

In vehicle cabins, there are background sounds, such as a navigation guide voice, a movie reproducing sound, a television reproducing sound, a music reproducing sound and the like, and thus, there is a problem that it is hard for occupants therein to listen to the conversation between them. In order to solve this problem, there is proposed an ICC (In Car Communication) system in which a spoken voice of the driver is collected by a microphone and is then outputted from a speaker toward an occupant on a rear seat.

As a conventional technology of controlling a spoken voice of an interlocutor, there is, for example, a voice control technology for teleconference system described in Patent Literature 1. In the teleconference system, a synthetic image in which faces of conference participants are being placed side by side is displayed on a monitor of each conference terminal, and a synthetic sound of voices of the conference participants is outputted from a speaker of each conference terminal. When one of the conference participants performs an operation for expanding the face image of a specific conference participant, the sound level of a spoken voice of the specific conference participant becomes higher according to the size of the face image.

CITATION LIST

Patent Literature

Patent Literature 1: Japanese Patent Application Laid-open No. 2008-67203

SUMMARY OF INVENTION

Technical Problem

In the teleconference system according to Patent Literature 1, overlapping target sounds are only human voices, so that, even though the sound level may be somewhat different for every conference terminal, voices that are almost the same in sound level are controlled. Thus, in the teleconference system, it is possible to listen to the spoken voice of the specific conference participant with ease merely by increasing the sound level of that spoken voice.

In contrast, in the vehicle cabins, there are various types of background sounds that may overlap a spoken voice, such as a navigation guide voice, a movie reproducing sound, a television reproducing sound, a music reproducing sound and the like, and further, their sound levels are varied over a wide range. Thus, it encounters a problem that it is hard to clearly listen to the spoken voice merely by increasing, like in the teleconference system, the sound level of the spoken voice outputted from the speaker. For example, in the case where an occupant on a rear seat is watching an explosion scene or battle scene of a movie at loud volume, even if the ICC system maximizes the sound level of the spoken voice of the driver, it is highly likely that the occupant on the rear seat cannot listen to that spoken voice. In that case, the occupant on the rear seat has to suspend reproduction of an AV under watching or to mute the reproduced sound of the AV, and is thus prevented from watching it continuously.

This invention has been made to solve the problem as described above, and an object thereof is to facilitate the conversation between occupants in a vehicle cabin.

Solution to Problem

An inter-occupant conversation device according to the invention comprises: a display unit to display a first occupant image of a first occupant to a second occupant; an operational information acquisition unit to acquire operational information for changing a size of the first occupant image displayed on the display unit; an image control unit to change the size of the first occupant image displayed on the display unit, on a basis of the operational information acquired by the operational information acquisition unit; a sound control unit to control, at a time of generating a synthetic sound by combining a spoken voice of the first occupant with a reproduced sound of an AV source, a sound-level ratio between the spoken voice of the first occupant and the reproduced sound of the AV source, on a basis of the size of the first occupant image displayed on the display unit; and a sound output unit to output the synthetic sound generated by the sound control unit to the second occupant.

Advantageous Effects of Invention

According to the invention, since the sound-level ratio between the spoken voice of the first occupant and the reproduced sound of the AV source is controlled on the basis of the size of the first occupant image displayed on the display unit, it is possible to facilitate the conversation between occupants in a vehicle cabin.

DESCRIPTION OF EMBODIMENTS

Hereinafter, for illustrating the invention in more detail, embodiments for carrying out the invention will be described according to the accompanying drawings.

Embodiment 1

Figure 1:
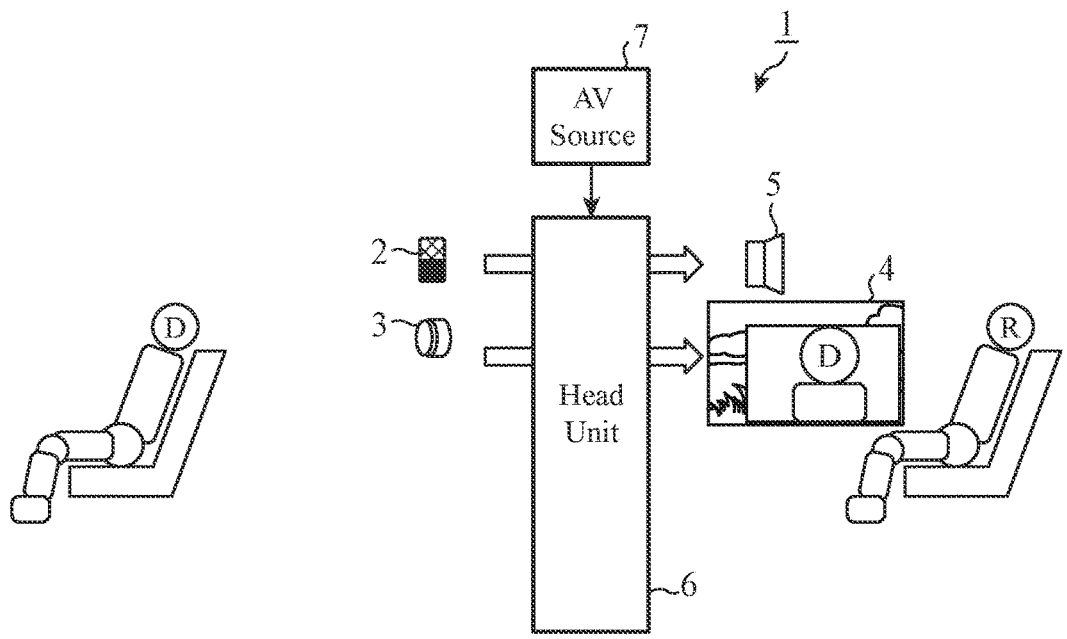
FIG. 1 is a conceptual diagram showing an outline of an inter-occupant conversation device according to a first embodiment.

FIG. 1 is a conceptual diagram showing an outline of an inter-occupant conversation device 1 according to the first embodiment. The inter-occupant conversation device 1 according to the first embodiment serves to facilitate the conversation between an occupant on a driver's seat (hereinafter, referred to as a driver D) and an occupant on a rear seat (hereinafter, referred to as a rear occupant R), and further to allow the rear occupant R to adjust the sound level of a voice that he/she wants to listen to, through his/her intuitive operation. The driver D corresponds to a first occupant and the rear occupant R corresponds to a second occupant.

The inter-occupant conversation device 1 includes: a microphone for driver 2 and a camera for driver 3 that are placed around the driver's seat; a rear display 4 and a rear speaker 5 that are placed around the rear seat; and a head unit 6 placed in a vehicle cabin. The microphone for driver 2 collects a spoken voice of the driver D and outputs it to the head unit 6. The camera for driver 3 images the face of the driver D and outputs the result as a driver image to the head unit 6. The rear display 4 receives through the head unit 6, a synthetic image in which the driver image imaged by the camera for driver 3 and a reproduced image of an AV source 7 are combined, and displays it to the rear occupant R. The rear display 4 corresponds to a display unit. The rear speaker 5 receives through the head unit 6, a synthetic sound in which the spoken voice of the driver D and collected by the microphone for driver 2 and a reproduced sound of the AV source 7 are combined, and acoustically outputs it to the rear occupant R. The rear speaker 5 corresponds to a sound output unit. The head unit 6 controls a sound-level ratio between the spoken voice of the driver D and the reproduced sound of the AV source 7, on the basis of a size of the driver image to be displayed on the rear display 4.

With the configuration of FIG. 1, the rear occupant R listens to the spoken voice of the driver D speaking while facing forward, through the rear speaker 5. Further, the rear occupant R speaks facing toward the driver D, so that the driver D listens directly to a spoken voice of the rear occupant R. Thus, a conversation can be established between the driver D and the rear occupant R.

Figure 2:
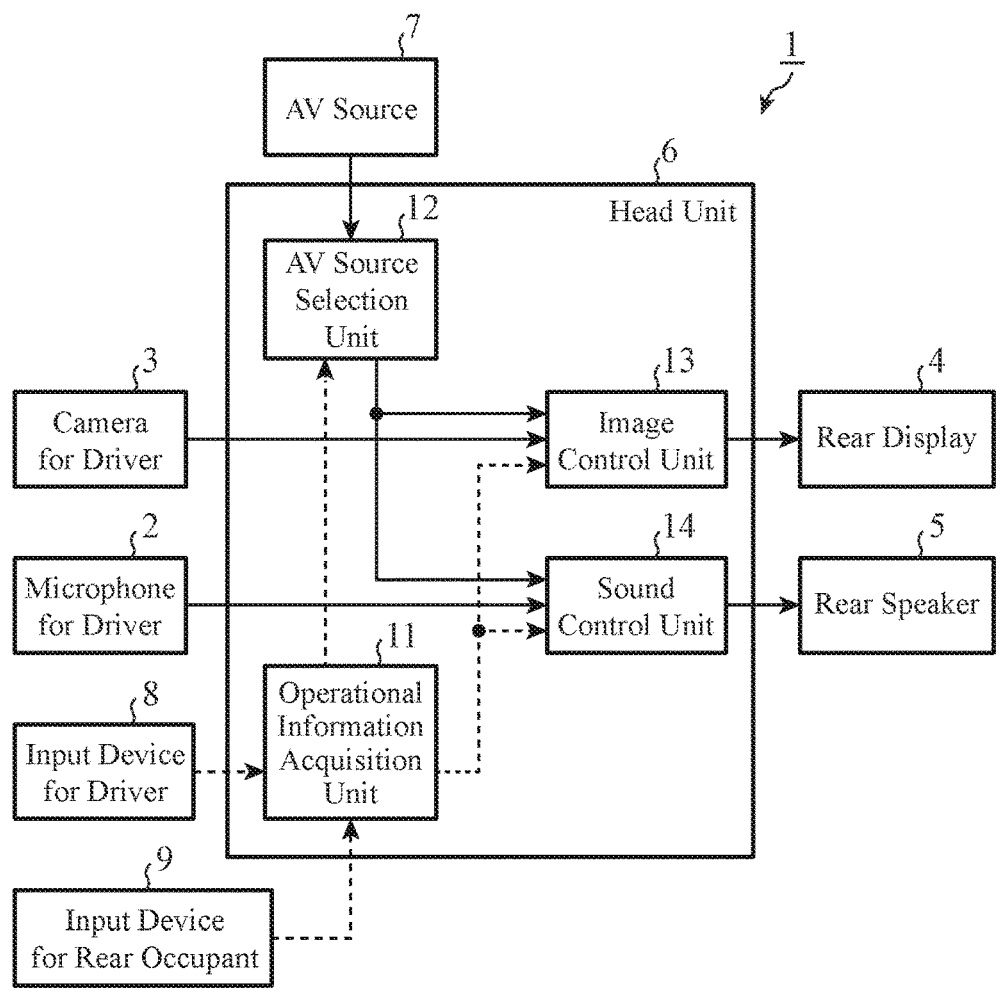
FIG. 2 is a block diagram showing a configuration example of the inter-occupant conversation device according to the first embodiment.

FIG. 2 is a block diagram showing a configuration example of the inter-occupant conversation device 1 according to the first embodiment. In FIG. 2, solid-line arrows each indicate a flow of sound information or image information, and broken-line arrows each indicate a flow of operational information.

An input device for driver 8 accepts an operation of the driver D, and then inputs operational information indicating the content of the operation to an operational information acquisition unit 11 in the head unit 6. The input device for driver 8 is a remote-control switch provided on a steering wheel, a voice recognition device, a touch panel integrated with a front display 24 in the second embodiment to be described later, a hardware switch provided around the front display 24, or the like.

An input device for rear occupant 9 accepts an operation of the rear occupant R, and then outputs operational information indicating the content of the operation to the operational information acquisition unit 11 in the head unit 6. The input device for rear occupant 9 is a touch panel integrated with the rear display 4, a hardware switch provided around the rear display 4, a voice recognition device, or the like.

The head unit 6 includes the operational information acquisition unit 11, an AV source selection unit 12, an image control unit 13 and a sound control unit 14.

The operational information acquisition unit 11 acquires operational information inputted to the input device for driver 8 by the driver D or operational information inputted to the input device for rear occupant 9 by the rear occupant R, and outputs it to the AV source selection unit 12, the image control unit 13 or the sound control unit 14.

The AV source selection unit 12 receives from the operational information acquisition unit 11, operational information about selection of an AV source by the rear occupant R. The AV source selection unit 12 selects the AV source 7 on the basis of the received operational information, and outputs image information and sound information of the selected AV source 7 to the image control unit 13 and the sound control unit 14, respectively. The AV source 7 is, for example, a navigation device; a mobile phone or smartphone; a disc reproduction device for a CD (Compact Disc), a DVD (Digital Versatile Disc), a BD (Blu-ray Disc: Registered Trademark), or the like; a storage medium to be wirelessly connected to the head unit 6 via Bluetooth (Registered Trademark), WiFi or the like; or a storage medium such as an SD card, a USB (Universal Serial Bus) memory, a memory incorporated in the head unit 6, or the like. The AV source 7 is not limited to the above examples and may be TV broadcasting, radio broadcasting, stream distribution or the like. For example, when the rear occupant R has operated the input device for rear occupant 9 to thereby select a navigation device as the AV source 7, the AV source selection unit 12 outputs a map screen and a navigation guide voice from the navigation device to the image control unit 13 and the sound control unit 14, respectively. For further example, when the rear occupant R has operated the input device for rear occupant 9 to thereby select a DVD as the AV source 7, the AV source selection unit 12 outputs a DVD reproduced image and a DVD reproduced sound from a disc device to the image control unit 13 and the sound control unit 14, respectively.

The image control unit 13 receives the driver image from the camera for driver 3 and receives the reproduced image of the AV source 7 from the AV source selection unit 12. Further, the image control unit 13 receives operational information about initiation of conversation by the driver D or the rear occupant R and operational information about change in size of the driver image by the rear occupant R, from the operational information acquisition unit 11. Generally, the image control unit 13 causes the rear display 4 to display the reproduced image of the AV source 7 received from the AV source selection unit 12. On the other hand, the image control unit 13, when having received the operational information about initiation of conversation, causes the rear display 4 to display a synthetic image in which the driver image is superimposed on the reproduced image of the AV source 7 (so called "picture-in-picture"). The image control unit 13, when having further received the operational information about change in size of the driver image, changes the size of the driver image relative to the reproduced image of the AV source 7, according to the operational information, and causes the rear display 4 to display the synthetic image after that change.

The sound control unit 14 receives the spoken voice of the driver D from the microphone for driver 2 and receives the reproduced sound of the AV source 7 from the AV source selection unit 12. Further, the sound control unit 14 receives the operational information about initiation of conversation by the driver D or the rear occupant R and the operational information about change in size of the driver image by the rear occupant R, from the operational information acquisition unit 11. Generally, the sound control unit 14 causes the rear speaker 5 to acoustically output the reproduced sound of the AV source 7 received from the AV source selection unit 12. On the other hand, the sound control unit 14, when having received the operational information about initiation of conversation, causes the rear speaker 5 to acoustically output the synthetic sound in which the spoken voice of the driver D is combined with the reproduced sound of the AV source 7. The sound control unit 14, when having further received the operational information about change in size of the driver image, controls the sound-level ratio between the spoken voice of the driver D and the reproduced sound of the AV source 7 so that it corresponds to a screen-size ratio between the driver image based on the operational information and the reproduced image of the AV source 7, and causes the rear speaker 5 to acoustically output the synthetic sound after such control.

Figure 3A:
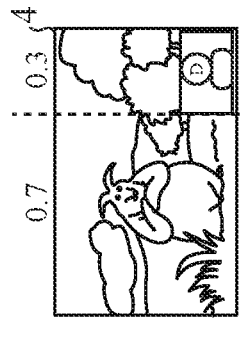
FIGS. 3A, 3B and 3C are diagrams each showing a correspondence relationship between a screen-size ratio in a rear display and a sound-level ratio of a rear speaker, according to the first embodiment.
Figure 3B:
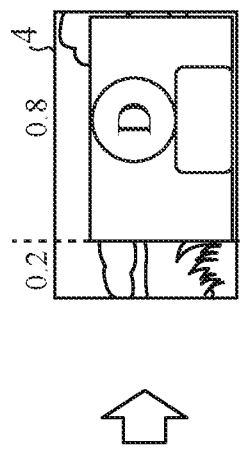
Figure 3C:
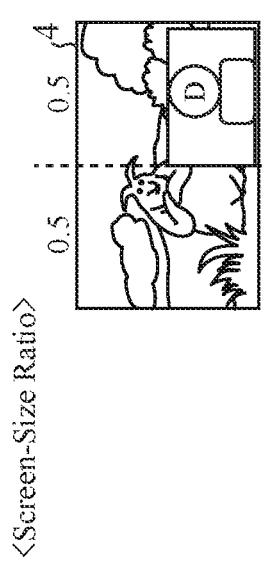

FIGS. 3A, 3B and 3C are diagrams each illustrating a correspondence relationship between the screen-size ratio in the rear display 4 and the sound-level ratio of the rear speaker 5, according to the first embodiment.

In these cases, the reproduced image of the AV source 7 is displayed over the entire screen of the rear display 4, and the driver image is displayed on the lower right side in the screen of the rear display 4. The driver image is expanded or reduced along the diagonal direction with reference to the bottom right corner. A ratio between a screen-lateral direction length of a region in the reproduced image of the AV source 7 other than that for the driver image and a screen-lateral direction length of the driver image, is used as the screen-size ratio. Note that, depending on the type of the AV source 7, a case may arise in which no reproduced image is provided; however, because any reproduced image of the AV source 7 is to be displayed over the entire screen of the rear display 4, a size of the screen of the rear display 4 may be used instead of a size of the reproduced image.

In the case of FIG. 3A, the screen-size ratio between the reproduced image of the AV source 7 and the driver image is 0.5:0.5. In this case, the sound control unit 14 controls the sound-level ratio between the reproduced sound of the AV source 7 and the spoken voice of the driver D, to 0.5:0.5.

In the case of FIG. 3B, the screen-size ratio between the reproduced image of the AV source 7 and the driver image is 0.2:0.8. In this case, the sound control unit 14 controls the sound-level ratio between the reproduced sound of the AV source 7 and the spoken voice of the driver D, to 0.2:0.8.

In the case of FIG. 3C, the screen-size ratio between the reproduced image of the AV source 7 and the driver image is 0.7:0.3. In this case, the sound control unit 14 controls the sound-level ratio between the reproduced sound of the AV source 7 and the spoken voice of the driver D, to 0.7:0.3.

In this manner, the sound control unit 14 changes the sound-level ratio within from 0.0:1.0 to 1.0:0.0 in accordance with the screen-size ratio varying from 0.0:1.0 to 1.0:0.0. This allows the rear occupant R to emphasize a voice that he/she wants to listen to, by performing such a visual operation of expanding or reducing the driver image.

Next, an example of how to control the sound-level ratio will be described.

Figure 4:
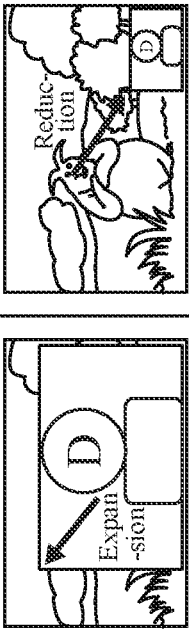
FIG. 4 is a diagram for illustrating an example of how to control the sound-level ratio in the first embodiment.

FIG. 4 is a diagram for illustrating an example of how to control the sound-level ratio in the first embodiment. In this example, the sound control unit 14 controls the sound-level ratio between the reproduced sound of the AV source 7 and the spoken voice of the driver D, by preferentially changing the sound level of the spoken voice of the driver D.

In FIG. 4, when a conversation initiation operation has been performed by the driver D or the rear occupant R, the image control unit 13 causes the rear display 4 to display an initial-state synthetic image with the screen-size ratio of 0.5:0.5. The sound control unit 14 sets the sound level of the reproduced sound of the AV source 7 in the initial state after initiation of conversation, to be the same as a sound level having been set by the rear occupant R before initiation of conversation. Namely, it is assumed that the sound level of the reproduced sound of the AV source 7 remains unchanged before and after initiation of conversation. Instead, when an initial sound level has been set beforehand for the sound control unit 14, the sound control unit 14 sets the sound level of the reproduced sound of the AV source 7 in the initial state after initiation of conversation, to that initial sound level. The sound control unit 14 sets the sound level of the spoken voice of the driver D to a sound level corresponding to the sound level of the reproduced sound of the AV source 7. Namely, when the sound level of the reproduced sound of the AV source 7 before initiation of conversation is relatively low (A-1), the sound level of the spoken voice of the driver D is provided similarly as a relatively low-sound level at the time of initiation of conversation. In contrast, when the sound level of the reproduced sound of the AV source 7 before initiation of conversation is relatively high (A-2), the sound level of the spoken voice of the driver D is provided similarly as a relatively high-sound level at the time of initiation of conversation.

When an operation for expanding the driver image has been performed by the rear occupant R, the image control unit 13 causes the rear display 4 to display the synthetic image with the screen-size ratio of 0.2:0.8. The sound control unit 14 increases the sound level of the spoken voice of the driver D to thereby set the sound-level ratio to 0.2:0.8 (B-1). However, an upper limit is predetermined for the sound level of the spoken voice of the driver D. In the case where the sound level of the spoken voice of the driver D will go beyond the upper limit when the sound level of the spoken voice is increased according to such an expanding operation, the sound control unit 14 increases the sound level of the spoken voice up to the upper limit, while decreasing the sound level of the reproduced sound of the AV source 7, to thereby set the sound-level ratio to 0.2:0.8 (B-2). By establishing the upper limit for the sound level of the spoken voice of the driver D, it is prevented that the spoken voice is acoustically outputted at loud volume from the rear speaker 5, due to a rapid operation by the rear occupant R for expanding the driver image.

When an operation for reducing the driver image has been performed by the rear occupant R, the image control unit 13 causes the rear display 4 to display the synthetic image with the screen-size ratio of 0.7:0.3. The sound control unit 14 decreases the sound level of the spoken voice of the driver D to thereby set the sound-level ratio to 0.7:0.3 (C-1). Note that, when such a reducing operation has been performed in a state where the sound level of the spoken voice of the driver D reached the upper limit (C-2), the sound control unit 14 decreases the spoken voice of the driver D after setting back the sound level of the reproduced sound of the AV source 7 to the sound level having been set by the rear occupant R before initiation of conversation or to the initial sound level having been set beforehand, to thereby set the sound-level ratio to 0.7:0.3.

Figure 5:
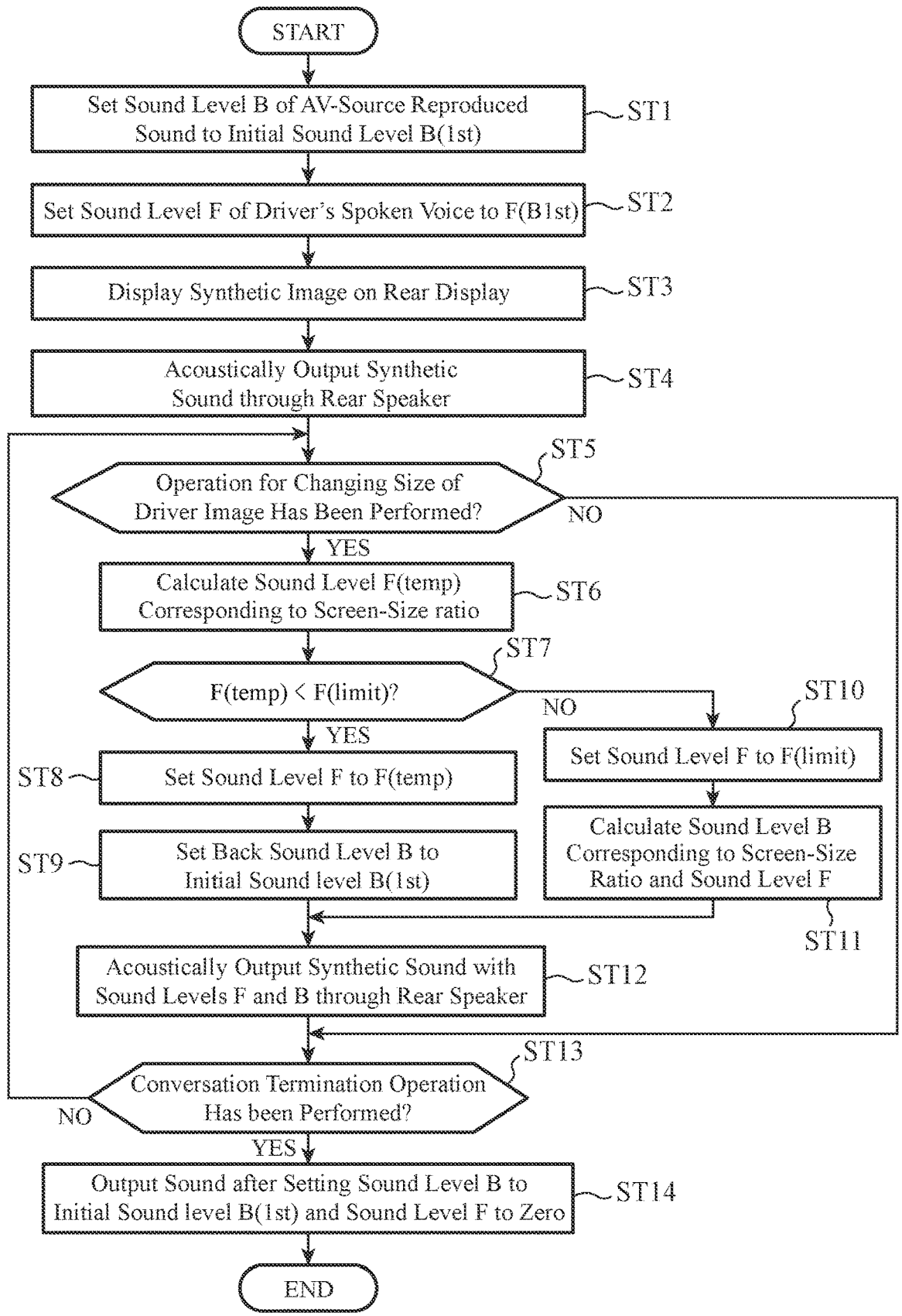
FIG. 5 is a flowchart for illustrating the example of how to control the sound-level ratio in the first embodiment.

FIG. 5 is a flowchart for illustrating the example of how to control the sound-level ratio in the first embodiment. According to the flowchart of FIG. 5, as illustrated in FIG. 4, the sound control unit 14 controls the sound-level ratio between the reproduced sound of the AV source 7 and the spoken voice of the driver D, by preferentially changing the sound level of the spoken voice of the driver D. When a conversation initiation operation has been performed by the driver D or the rear occupant R, the inter-occupant conversation device 1 starts the operations shown in the flowchart of FIG. 5.

Figure 6:
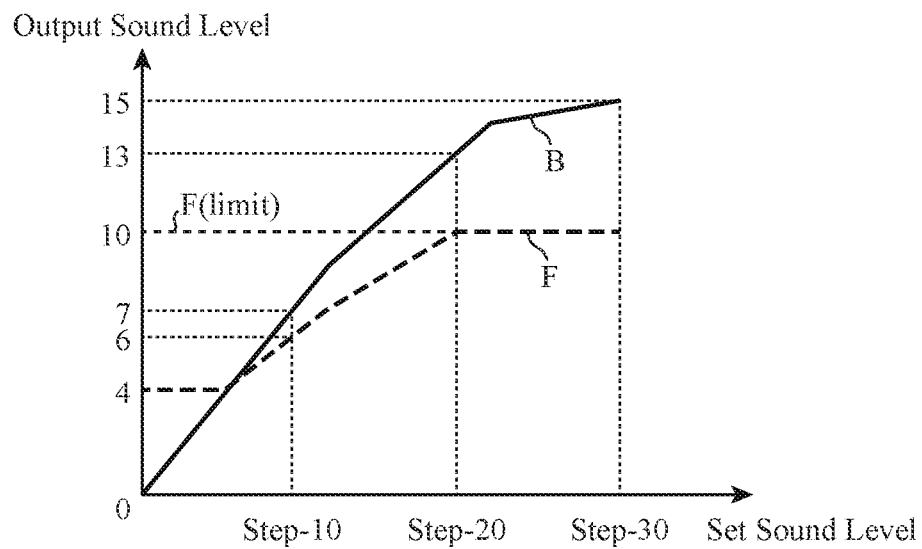
FIG. 6 is a graph showing an example of sound-level set curves according to the first embodiment.

FIG. 6 is a graph showing an example of sound-level set curves according to the first embodiment. The abscissa in the graph represents a sound level to be set through operation by the rear occupant R, and the ordinate in the graph represents a sound level at which the sound control unit 14 causes the rear speaker 5 to output a sound. In the following, the sound level of the reproduced sound of the AV source 7 is indicated with "B" and the sound level of the spoken voice of the driver D is indicated with "F". Information of the sound-level set curves for the sound level B and the sound level F as shown in FIG. 6, is preset in the sound control unit 14. Note that, as described previously, an upper limit F(limit) is determined for the sound level F of the spoken voice of the deriver D. In this example, the rear occupant R is allowed to control the sound level between Step-0 to Step-30. For example, when the rear occupant R has performed an operation for setting the sound level B of the reproduced sound of the AV source 7 to Step-10, the sound control unit 14 controls the sound level B of the reproduced sound of the AV source 7 to "7" on the basis of the sound-level set curve for the sound level B, and causes the rear speaker 5 to output that sound.

When a conversation initiation operation has been performed by the driver D or the rear occupant R, the sound control unit 14 sets in Step ST1 in FIG. 5, the sound level B of the reproduced sound of the AV source 7 to an initial sound level B(1st). The initial sound level B(1st) is a sound level having been set by the rear occupant R before initiation of conversation and is, for example, "7" that corresponds to Step-10 in FIG. 6.

In Step ST2, the sound control unit 14 sets the sound level F of the spoken voice of the driver D to a sound level F(B1st) that is uniquely determined by the initial sound level B(1st) of the reproduced sound of the AV source 7. For example, when the initial sound level B(1st) of the reproduced sound of the AV source 7 is "7" that corresponds to Step-10, the sound level F(B1st) is "6" that corresponds to the same Step-10.

In Step ST3, the image control unit 13 causes the rear display 4 to display the synthetic image in which the reproduced image of the AV source 7 and the driver image are combined. Here, in the initial state at the time of initiation of conversation, a ratio Wd of the screen-lateral direction length of the driver image relative to the screen-lateral direction length of the rear display 4 is assumed to be "0.5". Namely, in this case, the screen-size ratio between the reproduced image of the AV source 7 and the driver image in the initial state is 0.5:0.5. The initial value of the ratio Wd is not limited to "0.5" and may be any given value.

In Step ST4, the sound control unit 14 causes the rear speaker 5 to acoustically output the synthetic sound in which the reproduced sound of the AV source 7 is controlled to have the initial sound level B(1st) and the spoken voice of the driver D is controlled to have the sound level F(B1st). In this case, since the screen-size ratio in the initial state is set to 0.5:0.5, the sound control unit 14 regards the ratio of B(1st):F(B1st)=7:6 as the sound-level ratio of 0.5:0.5 corresponding to the screen-size ratio of 0.5:0.5.

It is noted that when, for example, the initial sound level B(1st) of the reproduced sound of the AV source 7 is "0" that corresponds to Step-0, the sound level F(B1st) is "4" that corresponds to the same Step-0. In this case, the sound control unit 14 regards the ratio of B(1st):F(B1st)=0:4 as the sound-level ratio of 0.5:0.5 corresponding to the screen-size ratio of 0.5:0.5.

Further, when, for example, the initial sound level B(1st) of the reproduced sound of the AV source 7 is "13" that corresponds to Step-20, the sound level F(B1st) is the upper limit of "10" that corresponds to the same Step-20. In this case, the sound control unit 14 regards the ratio of B(1st):F(B1st)=13:10 as the sound-level ratio of 0.5:0.5 corresponding to the screen-size ratio of 0.5:0.5.

In Step ST5, when an operation for changing the size of the driver image has been performed by the rear occupant R (Step ST5 "YES"), the sound control unit 14 proceeds to Step ST6, and otherwise (Step ST5 "NO"), it proceeds to Step ST13.

In Step ST6, the sound control unit 14 calculates a sound level F(temp) of the spoken voice of the driver D that corresponds to the screen-size ratio changed in Step ST5. For example, the sound control unit 14 calculates the sound level F(temp) according to the following formula (1).

$$F(temp) = Wd/(1-Wd) \times F(B1st) \qquad (1)$$

In Step ST7, when the sound level F(temp) calculated in Step ST6 is less than the upper limit F(limit) (Step ST7 "YES"), the sound control unit 14 proceeds to Step ST8, and when the sound level F(temp) is equal to or more than the upper limit F(limit) (Step ST7 "NO"), it proceeds to Step ST10.

In Step ST8, the sound control unit 14 sets the sound level F of the spoken voice of the driver D, to the sound level F(temp) calculated in Step ST6.

In Step ST9, the sound control unit 14 sets the sound level B of the reproduced sound of the AV source 7, to the initial sound level B(1st).

In Step ST10, the sound control unit 14 sets the sound level F of the spoken voice of the driver D, to the upper limit F(limit).

In Step ST11, the sound control unit 14 calculates the sound level B of the reproduced sound of the AV source 7 that corresponds to the screen-size ratio changed in Step ST5 and to the sound level F set in Step ST10. For example, the sound control unit 14 calculates the sound level B according to a following formula (2).

$$B = (1-Wd)/Wd \times B(1st)/F(B1st) \times F \qquad (2)$$

In Step ST12, the sound control unit 14 causes the rear speaker 5 to acoustically output the synthetic sound controlled to have the sound level F and the sound level B respectively set in Step ST8 and Step ST9, or the synthetic sound controlled to have the sound level F and the sound level B respectively set in Step ST10 and Step ST11.

In Step ST13, when a conversation termination operation has been performed by the driver D or the rear occupant R (Step ST13 "YES"), the sound control unit 14 proceeds to Step ST14, and otherwise (Step ST13 "NO"), it returns to Step ST5.

In Step ST14, the sound control unit 14 sets the sound level B of the reproduced sound of the AV source 7, to the initial sound level B(1st) before initiation of conversation. In addition, the sound control unit 14 sets the sound level F of the spoken voice of the driver D, to zero, to thereby mute that voice. The sound control unit 14 causes the rear speaker 5 to acoustically output the synthetic sound controlled to have the thus-set sound level F and sound level B.

As described above, the rear display 4 in the first embodiment displays the driver image of the driver D to the rear occupant R. The operational information acquisition unit 11 acquires operational information to be used for changing a size of the driver image displayed on the rear display 4. The image control unit 13 changes the size of the driver image displayed on the rear display 4, on the basis of the operational information acquired by the operational information acquisition unit 11. The sound control unit 14 controls, at the time of generating a synthetic sound in which a spoken voice of the driver D is combined with a reproduced sound of the AV source 7, the sound-level ratio between the spoken voice of the driver D and the reproduced sound of the AV source 7, on the basis of the size of the driver image displayed on the rear display 4. The rear speaker 5 outputs the synthetic sound generated by the sound control unit 14 to the rear occupant R. Since the sound level of the spoken voice of the driver D and the sound level of the reproduced sound of the AV source 7 are changed relatively to each other, the rear occupant R can listen to the spoken voice of the driver D overlapping the reproduced sound of the AV source 7. Thus, the inter-occupant conversation device 1 can facilitate the conversation between the driver D and the rear occupant R in a vehicle cabin.

Further, the rear occupant R can intuitively adjust the sound level through an operation of expanding or reducing the driver image.

Further, the sound control unit 14 in the first embodiment causes the sound-level ratio between the spoken voice of the driver D and the reproduced sound of the AV source 7 to correspond to the screen-size ratio between the driver image and the display screen of the rear display 4. Accordingly, the rear occupant R can intuitively adjust the sound level through a visual operation of expanding or reducing the driver image.

It is noted that, in the first embodiment, a ratio between a screen-lateral direction length of a region in the display screen of the rear display 4 other than that for the driver image and a screen-lateral direction length of the driver image, is used as the screen-size ratio; however, the screen-size ratio is not limited thereto. For example, the screen-size ratio may be a ratio between the area of the display screen of the rear display 4 and the area of the driver image, or the like.

Further, the sound control unit 14 in the first embodiment controls the sound-level ratio between the spoken voice of the driver D and the reproduced sound of the AV source 7, by preferentially changing the sound level of the spoken voice of the driver D. In addition, when the sound level of the spoken voice of the driver D has reached the predetermined upper limit, the sound control unit 14 controls the sound-level ratio by changing the sound level of the reproduced sound of the AV source 7. By establishing the upper limit for the sound level of the spoken voice of the driver D, it is possible to prevent the spoken voice from being acoustically outputted at loud volume from the rear speaker 5, due to a rapid operation by the rear occupant R for expanding the driver image.

It is noted that the sound control unit 14 may control the sound-level ratio between the spoken voice of the driver D and the reproduced sound of the AV source 7, by preferentially changing the sound level of the reproduced sound of the AV source 7, instead of the spoken voice of the driver D.

Embodiment 2

Figure 7:
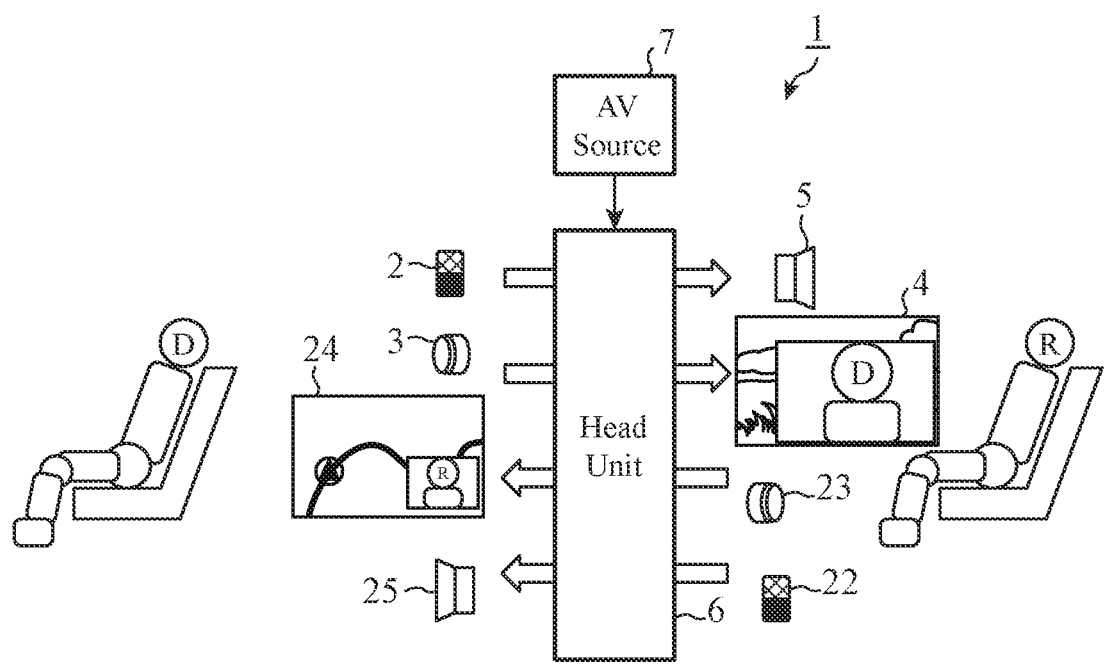
FIG. 7 is a conceptual diagram showing an outline of an inter-occupant conversation device according to a second embodiment.
Figure 8:
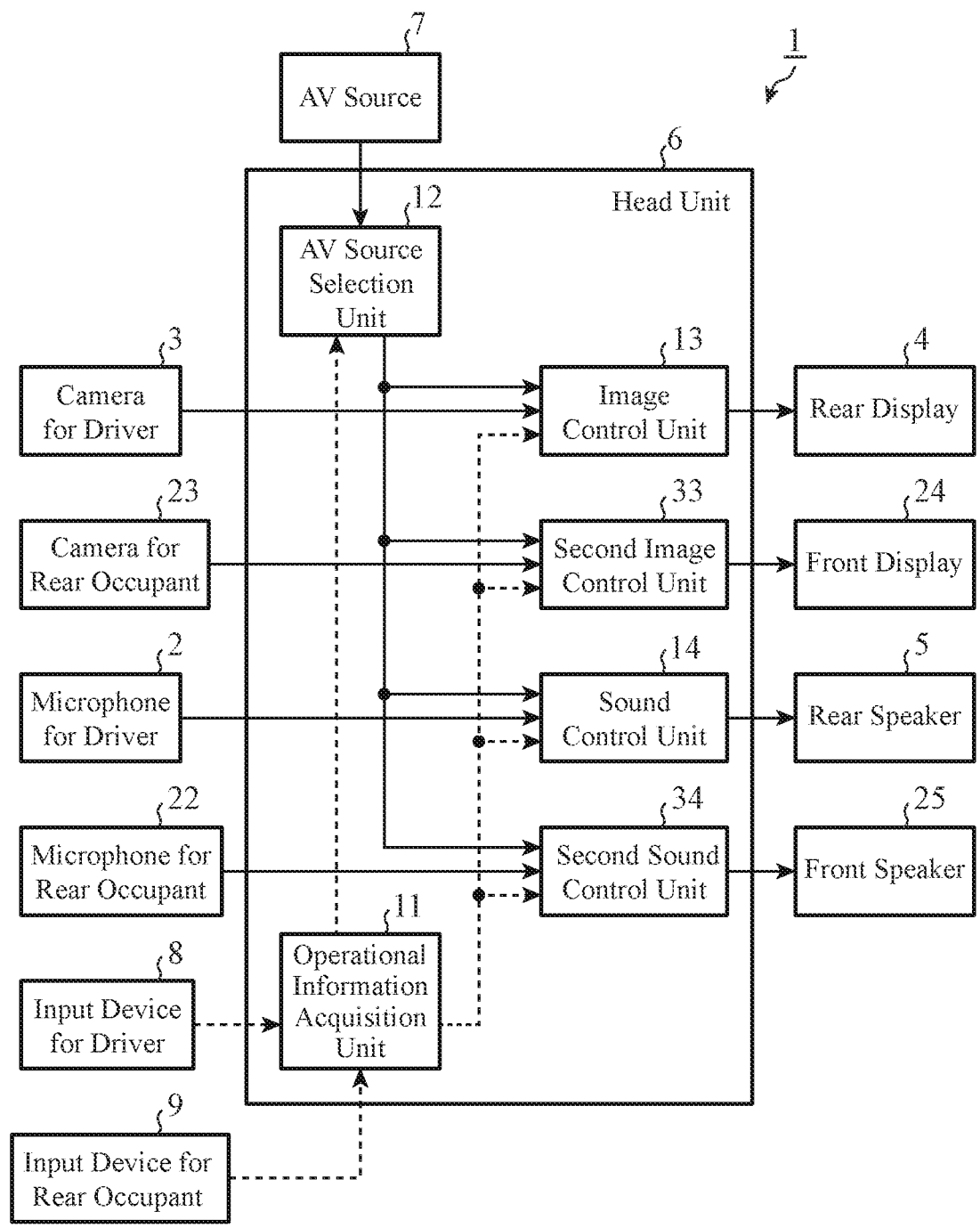
FIG. 8 is a block diagram showing a configuration example of the inter-occupant conversation device according to the second embodiment.

FIG. 7 is a conceptual diagram showing an outline of an inter-occupant conversation device 1 according to the second embodiment. FIG. 8 is a block diagram showing a configuration example of the inter-occupant conversation device 1 according to the second embodiment. The inter-occupant conversation device 1 according to the second embodiment has a configuration which results from addition of a microphone for rear occupant 22, a camera for rear occupant 23, the front display 24, a front speaker 25, a second image control unit 33 and a second sound control unit 34, to the inter-occupant conversation device 1 of the first embodiment shown in FIG. 1. In FIGS. 7 and 8, with respect to the parts that are the same as or equivalent to those in FIGS. 1 and 2, the same numerals are given thereto, and description thereof will be omitted.

The inter-occupant conversation device 1 according to the first embodiment has a configuration that acoustically outputs the spoken voice of the driver D, from the rear speaker 5 toward the rear occupant R. In contrast, the inter-occupant conversation device 1 according to the second embodiment has a configuration that, in addition to acoustically outputting the spoken voice of the driver D from the rear speaker 5, acoustically outputs a spoken voice of the rear occupant R from the front speaker 25 toward the driver D.

The microphone for rear occupant 22 and the camera for rear occupant 23 are placed around the rear seat. The microphone for rear occupant 22 collects a spoken voice of the rear occupant R and outputs it to the head unit 6. The camera for rear occupant 23 images the face of the rear occupant R and outputs the result as a rear-occupant image to the head unit 6. The front display 24 and the front speaker 25 are placed around the driver's seat. The front display 24 corresponds to a second display unit. The front speaker 25 corresponds to a second sound output unit.

The operational information acquisition unit 11 acquires operational information inputted to the input device for driver 8 by the driver D, or operational information inputted to the input device for rear occupant 9 by the rear occupant R, and outputs it to the AV source selection unit 12, the image control unit 13, the second image control unit 33, the sound control unit 14 or the second sound control unit 34.

The AV source selection unit 12 receives from the operational information acquisition unit 11, operational information about selection of an AV source by the driver D. The AV source selection unit 12 selects the AV source 7 on the basis of the received operational information, and outputs image information and sound information of the selected AV source 7 to the second image control unit 33 and the second sound control unit 34, respectively. In the case of FIG. 7, a navigation device is selected as the AV source 7, so that a map screen is displayed on the front display 24. The AV source selection unit 12 can select different AV sources for the rear display 4 and the front display 24, on the basis of operational information by the driver D and the rear occupant R.

The second image control unit 33 receives the rear-occupant image from the camera for rear occupant 23 and receives the reproduced image of the AV source 7 from the AV source selection unit 12. Further, the second image control unit 33 receives operational information about initiation of conversation by the driver D or the rear occupant R and operational information about change in size of the rear-occupant image by the driver D, from the operational information acquisition unit 11. Generally, the second image control unit 33 causes the front display 24 to display the reproduced image of the AV source 7 received from the AV source selection unit 12. On the other hand, the second image control unit 33, when having received the operational information about initiation of conversation, causes the front display 24 to display a synthetic image in which the rear-occupant image is superimposed on the reproduced image of the AV source 7. The second image control unit 33, when having further received the operational information about change in size of the rear-occupant image, changes the size of the rear-occupant image relative to the reproduced image of the AV source 7, according to the operational information, and causes the front display 24 to display the synthetic image after that change.

The second sound control unit 34 receives the spoken voice of the rear occupant R from the microphone for rear occupant 22 and receives the reproduced sound of the AV source 7 from the AV source selection unit 12. Further, the second sound control unit 34 receives the operational information about initiation of conversation by the driver D or the rear occupant R and the operational information about change in size of the rear-occupant image by the driver D, from the operational information acquisition unit 11. Generally, the second sound control unit 34 causes the front speaker 25 to acoustically output the reproduced sound of the AV source 7 received from the AV source selection unit 12. On the other hand, the second sound control unit 34, when having received the operational information about initiation of conversation, causes the front speaker 25 to acoustically output a synthetic sound in which the spoken voice of the rear occupant R is combined with the reproduced sound of the AV source 7. The second sound control unit 34, when having further received the operational information about change in size of the rear-occupant image, controls a sound-level ratio between the spoken voice of the rear occupant R and the reproduced sound of the AV source 7 so that it corresponds to a screen-size ratio between the rear-occupant image based on the operational information and the reproduced image of the AV source 7, and causes the front speaker 25 to acoustically output the synthetic sound after such control. How the sound-level ratio is controlled by the second sound control unit 34 is the same as how the sound-level ratio is controlled by the sound control unit 14, so that description thereof will be omitted.

As described above, the front display 24 in the second embodiment displays the rear-occupant image of the rear occupant R to the driver D. The second image control unit 33 changes the size of the rear-occupant image displayed on the front display 24, on the basis of the operational information about change in size of the rear-occupant image displayed on the front display 24, acquired by the operational information acquisition unit 11. At the time of generating the synthetic sound in which the spoken voice of the rear occupant R is combined with the reproduced sound of the AV source 7, the second sound control unit 34 controls the sound-level ratio between the spoken voice of the rear occupant R and the reproduced sound of the AV source 7, on the basis of the size of the rear-occupant image displayed on the front display 24. The front speaker 25 outputs the synthetic sound generated by the second sound control unit 34 to the driver D. Since the sound level of the spoken voice of the rear occupant R and the sound level of the reproduced sound of the AV source 7 are changed relatively to each other, the driver D can listen to the spoken voice of the rear occupant R overlapping the reproduced sound of the AV source 7. Further, the inter-occupant conversation device 1 makes it easy for the rear occupant R and the driver D to listen to their spoken voices each other, and thus can further facilitate the conversation between the driver D and the rear occupant R in a vehicle cabin.

It is noted that, in the first embodiment and the second embodiment, cases have been described where the first occupant is the driver D and the second occupant is the rear occupant R; however, the first occupant and the second occupant may be any occupants in a vehicle cabin. For example, it is allowable that the first occupant is an occupant on the passenger's seat and the second occupant is the rear occupant R.

Lastly, description will be made about the hardware configuration of the head unit 6 in the inter-occupant conversation device 1 according to each of the embodiments.

Figure 9A:
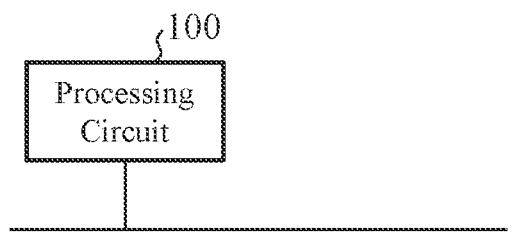
FIGS. 9A and 9B are diagrams each showing a hardware configuration example of a head unit in the inter-occupant conversation device according to each of the embodiments.
Figure 9B:
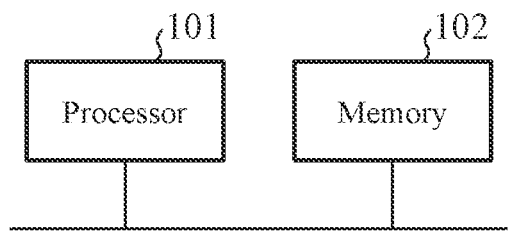

FIGS. 9A and 9B are diagrams each showing a hardware configuration example of the head unit 6 in the inter-occupant conversation device 1 according to each of the embodiments. In the head unit 6, each of the function of the operational information acquisition unit 11, the AV source selection unit 12, the image control unit 13, the sound control unit 14, the second image control unit 33 and the second sound control unit 34 are implemented by a processing circuit. Namely, the head unit 6 includes a processing circuit for implementing each of the functions. The processing circuit may be a processing circuit 100 as dedicated hardware, and may be a processor 101 which executes programs stored in a memory 102.

When the processing circuit is dedicated hardware as shown in FIG. 9A, the processing circuit 100 corresponds to, for example, a single circuit, a composite circuit, a programmed processor, a parallel-programmed processor, an ASIC (Application Specific Integrated Circuit), an FPGA (Field Programmable Gate Array) or any combination thereof. The functions of the operational information acquisition unit 11, the AV source selection unit 12, the image control unit 13, the sound control unit 14, the second image control unit 33 and the second sound control unit 34 may be implemented by plural processing circuits 100, and the function of each unit may be implemented collectively by one processing circuit 100.

When the processing circuit is the processor 101 as shown in FIG. 9B, the functions of the operational information acquisition unit 11, the AV source selection unit 12, the image control unit 13, the sound control unit 14, the second image control unit 33 and the second sound control unit 34 are implemented by software, firmware or a combination of software and firmware. The software and the firmware are each written as a program(s) and stored in the memory 102. The processor 101 reads out and executes programs stored in the memory 102 to thereby implement the function of each unit. Namely, the head unit 6 is provided with the memory 102 having stored therein the programs by which, when they are executed by the processor 101, the steps shown in the flowchart of FIG. 5 will be eventually executed. Further, it can also be said that these programs are programs for causing a computer to execute steps or processes of the operational information acquisition unit 11, the AV source selection unit 12, the image control unit 13, the sound control unit 14, the second image control unit 33 and the second sound control unit 34.

Here, the processor 101 means a CPU (Central Processing Unit), a processing device, an arithmetic device, a microprocessor, a microcomputer or the like.

The memory 102 may be a non-volatile or volatile semiconductor memory such as a RAM (Random Access Memory), a ROM (Read Only Memory), an EPROM (Erasable Programmable ROM), a flash memory or the like; may be a magnetic disc such as a hard disc, a flexible disc or the like; and may be an optical disc such as a CD, a DVD or the like.

It is noted that each of the functions of the operational information acquisition unit 11, the AV source selection unit 12, the image control unit 13, the sound control unit 14, the second image control unit 33 and the second sound control unit 34 may be implemented partly by dedicated hardware and partly by software or firmware. In this manner, the processing circuit in the head unit 6 can implement each of the aforementioned functions, by hardware, software, firmware or any combination thereof.

It should be noted that unlimited combination of the embodiments, modification of any configuration element in the embodiments and omission of any configuration element in the embodiments may be made in the present invention without departing from the scope of the invention.

INDUSTRIAL APPLICABILITY

The inter-occupant conversation device according to the invention facilitates the conversation between occupants in a vehicle cabin, and is thus suited for use in an ICC system or the like.

REFERENCE SIGNS LIST

1: inter-occupant conversation device,
2: microphone for driver,
3: camera for driver,
4: rear display (display unit),
5: rear speaker (sound output unit),
6: head unit,
7: AV source,
8: input device for driver,
9: input device for rear occupant,
11: operational information acquisition unit,
12: AV source selection unit,
13: image control unit,
14: sound control unit,
22: microphone for rear occupant,
23: camera for rear occupant,
24: front display (second display unit),
25: front speaker (second sound output unit),
33: second image control unit,
34: second sound control unit,
100: processing circuit,
101: processor,
102: memory,
D: driver, and
R: rear occupant.

What is claimed is:

1. An inter-occupant conversation device, comprising:
a first display to display a first occupant image of a first occupant to a second occupant;
processing circuitry to
acquire operational information for changing a size of the first occupant image displayed on the first display;
change the size of the first occupant image displayed on the first display, on a basis of the acquired operational information; and
control, at a time of generating a synthetic sound by combining a spoken voice of the first occupant with a reproduced sound of an AV source, a sound-level ratio between the spoken voice of the first occupant and the reproduced sound of the AV source, on a basis of the size of the first occupant image displayed on the first display; and
a first sound speaker to output the synthetic sound generated by the processing circuitry to the second occupant, so that both a first sound level of the spoken voice of the first occupant and a second sound level of the reproduced sound of the AV source are set on a basis of the controlled sound-level ratio.

2. The inter-occupant conversation device according to claim 1, wherein
the processing circuitry causes the sound-level ratio between the spoken voice of the first occupant and the reproduced sound of the AV source to correspond to a screen-size ratio between the first occupant image and the first display.

3. The inter-occupant conversation device according to claim 1, wherein
the processing circuitry controls the sound-level ratio by preferentially changing a sound level of the spoken voice of the first occupant and then, when the sound level of the spoken voice of the first occupant has reached a predetermined upper limit, controls the sound-level ratio by changing a sound level of the reproduced sound of the AV source.

4. The inter-occupant conversation device according to claim 1, wherein
the processing circuitry controls the sound-level ratio by preferentially changing a sound level of the reproduced sound of the AV source.

5. The inter-occupant conversation device according to claim 1, further comprising:
a second display to display a second occupant image of the second occupant to the first occupant, wherein the processing circuitry changes a size of the second occupant image displayed on the second display, on a basis of acquired operational information for changing the size of the second occupant image displayed on the second display, and controls, at a time of generating a synthetic sound by combining a spoken voice of the second occupant with a reproduced sound of the AV source, a sound-level ratio between the spoken voice of the second occupant and the reproduced sound of the AV source, on a basis of the size of the second occupant image displayed on the second display; and
a second speaker to output the synthetic sound generated by the second sound control unit to the first occupant.

6. The inter-occupant conversation device according to claim 1, wherein when determining that the size of the first occupant image on the first display is changed, the processing circuitry calculates a screen size ratio between the first occupant image and a reproduced image of the AV source and calculates the sound level of the spoken voice of the first occupant on the basis of the calculated screen size ratio.

7. The inter-occupant conversation device according to claim 6, wherein when determining that the calculated sound level of the spoken voice of the first occupant exceeds a predetermined upper limit, the processing circuitry sets the sound level of the spoken voice of the first occupant to the predetermined upper limit.

8. The inter-occupant conversation device according to claim 7, wherein when setting the sound level of the spoken voice of the first occupant to the predetermined upper limit, the processing circuitry calculates the sound level of the reproduced sound of the AV source on the basis of the calculated screen size ratio and the predetermined upper limit.

9. An inter-occupant conversation method, comprising:
displaying a first occupant image of a first occupant to a second occupant;
acquiring operational information for changing a size of the first occupant image displayed on a first display;
changing the size of the first occupant image displayed on the first display, on a basis of the acquired operational information;
controlling, at a time of generating a synthetic sound by combining a spoken voice of the first occupant with a reproduced sound of an AV source, a sound-level ratio between the spoken voice of the first occupant and the reproduced sound of the AV source, on a basis of the size of the first occupant image displayed on the first display; and
outputting the generated synthetic sound to the second occupant, so that both a first sound level of the spoken voice of the first occupant and a second sound level of the reproduced sound of the AV source are set on a basis of the control led sound-level ratio.

* * * * *